United States Patent
Chang et al.

(10) Patent No.: US 10,886,936 B2
(45) Date of Patent: Jan. 5, 2021

(54) IMAGE PROCESSING APPARATUS AND IMAGE PROCESSING METHOD

(71) Applicant: Raydium Semiconductor Corporation, Hsinchu (TW)

(72) Inventors: Yu-Min Chang, Taipei (TW); Chung-Sung Tsai, New Taipei (TW); Yan-Han Lin, New Taipei (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 16/705,327

(22) Filed: Dec. 6, 2019

(65) Prior Publication Data
US 2020/0195271 A1 Jun. 18, 2020

Related U.S. Application Data
(60) Provisional application No. 62/778,326, filed on Dec. 12, 2018.

(51) Int. Cl.
| | |
|---|---|
| *H03M 1/82* | (2006.01) |
| *H03M 3/00* | (2006.01) |
| *G06T 1/20* | (2006.01) |
| *G06T 5/50* | (2006.01) |
| *H03K 7/08* | (2006.01) |

(52) U.S. Cl.
CPC ............. *H03M 1/822* (2013.01); *G06T 1/20* (2013.01); *G06T 5/50* (2013.01); *H03K 7/08* (2013.01); *H03M 3/506* (2013.01)

(58) Field of Classification Search
CPC ........ H03M 1/822; H03M 3/506; H03M 1/50; H03M 1/82; G06T 1/20; G06T 5/50; H03K 7/08

USPC .......................................................... 341/152
See application file for complete search history.

(56) References Cited

U.S. PATENT DOCUMENTS

| | | | | |
|---|---|---|---|---|
| 7,742,072 B2* | 6/2010 | Tagawa | ............ | G08B 13/19641 348/154 |
| 7,760,401 B2* | 7/2010 | Ono | .................... | H04N 1/00127 358/296 |
| 8,144,999 B2* | 3/2012 | Morikawa | ............... | G11B 27/28 345/555 |
| 8,457,378 B2* | 6/2013 | Sato | ......................... | G06T 5/50 382/130 |
| 9,432,641 B2* | 8/2016 | Nishi | .................... | H04N 5/2355 |
| 9,843,721 B2* | 12/2017 | Yokokawa | .......... | H04N 5/23222 |
| 9,990,762 B2* | 6/2018 | Ahn | ...................... | G06T 15/506 |
| 2005/0057652 A1* | 3/2005 | Tagawa | .............. | H04N 21/4334 348/154 |

(Continued)

*Primary Examiner* — Jean B Jeanglaude

(57) ABSTRACT

An image processing apparatus is applied to a display and includes a sampling unit, a comparing unit, a determining unit and an operating unit. The sampling unit is configured to receive a pulse-width modulation (PWM) signal and sample the PWM signal to output a current image. The comparing unit is coupled to the sampling unit and configured to compare the current image with a previous image to generate a comparison result, wherein the previous image is prior to the current image. The determining unit is coupled to the comparing unit and configured to determine whether the current image is the same with the previous image according to the comparison result and a threshold value. If a determination result of the determining unit is YES, the operating unit stops its operation.

12 Claims, 3 Drawing Sheets

(56) References Cited

U.S. PATENT DOCUMENTS

2013/0142445 A1\* 6/2013 Park .................. H04N 19/136
                                                                          382/232
2014/0204246 A1\* 7/2014 Nishi ................... H04N 9/77
                                                                          348/239

\* cited by examiner

PWM
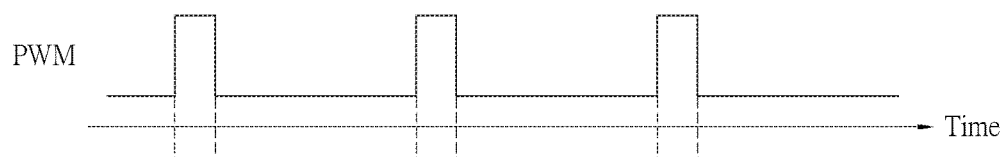
Time      FIG. 3A
PWM
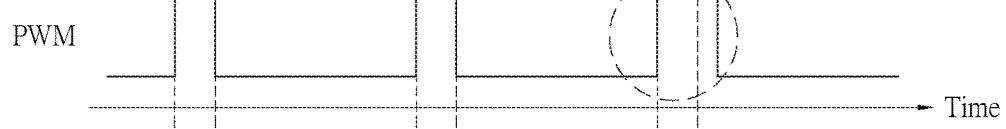
Time      FIG. 3B

IMAGE PROCESSING APPARATUS AND IMAGE PROCESSING METHOD

BACKGROUND OF THE INVENTION

1. Field of the Invention

The invention relates to image processing; in particular, to an image processing apparatus and an image processing method.

2. Description of the Prior Art

Please refer to FIG. 1. FIG. 1 illustrates a functional block diagram of an image processing apparatus in the prior art. As shown in FIG. 1, the image processing apparatus 1 includes a sampling unit 11, an operation unit 12, an output hysteresis unit 13, and a digital analog conversion (DAC) unit 14.

After the sampling unit 11 receives a pulse width modulation (PWM) signal PWM and performs sampling, the sampling unit 11 outputs the sampled image to the operation unit 12. After the operation unit 12 performs the duty cycle operation on the sampled image, the output hysteresis unit 13 outputs it to the DAC unit 14. The DAC unit 14 performs the digital analog conversion on it to output an output current IOUT.

However, when the display screen is not continuously updated, that is, consecutively input images are substantially the same, the operation unit 12 and the output hysteresis unit 13 in the conventional image processing apparatus 1 must continue to perform image operations and processing, resulting in unnecessary waste of power and computing resources. In addition, when a current image and a previous image are slightly different due to noise interference, the conventional image processing apparatus 1 fails to effectively filter out the noise, which affects a dimming result of the display, resulting in deterioration of the quality of the displayed image.

It can be seen from the above that many problems encountered in the prior art still need to be further solved.

SUMMARY OF THE INVENTION

Therefore, the invention provides an image processing apparatus and an image processing method to solve the above-mentioned problems occurred in the prior arts.

An embodiment of the invention is an image processing apparatus. In this embodiment, the image processing apparatus is applied to a display. The image processing apparatus includes a sampling unit, a comparing unit, a determining unit and an operation unit. The sampling unit is configured to receive a pulse-width modulation (PWM) signal and sample the PWM signal to output a current image. The comparing unit is coupled to the sampling unit and configured to compare the current image with a previous image to generate a comparison result, wherein the previous image is prior to the current image. The determining unit is coupled to the comparing unit and configured to determine whether the current image is the same with the previous image according to the comparison result and a threshold value. If a determination result of the determining unit is YES, the operation unit stops its operation.

In an embodiment, the comparison result is a difference between the current image and the previous image.

In an embodiment, if the difference is larger than a threshold, then the determination result of the determining unit is NO, the operation unit performs a duty cycle operation on the current image.

In an embodiment, if the difference is smaller than or equal to the threshold, then the determination result of the determining unit is YES, the operation unit stops its operation to reduce power consumption.

In an embodiment, the image processing apparatus further includes an output hysteresis unit and a digital analog conversion unit. The output hysteresis unit is coupled to the operation unit. The digital analog conversion unit is coupled to the output hysteresis unit. If the determination result of the determining unit is YES, the output hysteresis unit also stops its operation; if the determination result of the determining unit is NO, the operation unit performs a duty cycle operation on the current image and then the output hysteresis unit outputs it to the digital analog conversion unit to convert it into an output current.

In an embodiment, the image processing apparatus further includes a switching unit. The switching unit is coupled to the determining unit, the operation unit and the output hysteresis unit. If the determination result of the determining unit is YES, then the switching unit controls the operation unit and the output hysteresis unit to stop their operations.

Another embodiment of the invention is an image processing method. In this embodiment, the image processing method is applied to a display. The image processing method includes steps of: (a) receiving a PWM signal and sample the PWM signal to output a current image; (b) comparing the current image with a previous image to generate a comparison result, wherein the previous image is prior to the current image; (c) determining whether the current image is the same with the previous image according to the comparison result and a threshold value; and (d) if a determination result of the step (c) is YES, performing no operation and processing on the current image.

Compared to the prior art, the image processing apparatus and the image processing method of the invention can avoid unnecessary image repetition calculation and processing when the display screen is not continuously updated, thereby saving power and computing resources. In addition, when the current image and the previous image are slightly different due to noise interference, the image processing apparatus and the image processing method of the invention directly use the operation result of the previous image without recalculating the current image, so that the noise caused by the slight jitter of the pulse width modulation signal can be effectively filtered to improve the quality of the displayed image. Therefore, the image processing apparatus and the image processing method of the invention can effectively solve the problems of power consumption and noise interference encountered by the prior art.

The advantage and spirit of the invention may be understood by the following detailed descriptions together with the appended drawings.

BRIEF DESCRIPTION OF THE APPENDED DRAWINGS

FIG. 3A and FIG. 3B illustrate timing diagrams showing that whether the image obtained by sampling the pulse width modulation signal changes at different times respectively.

DETAILED DESCRIPTION OF THE INVENTION

Figure 1:
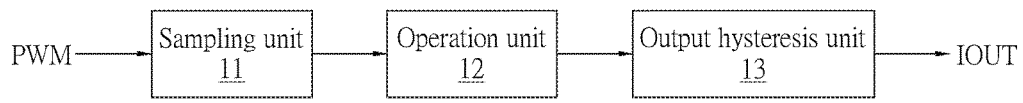
FIG. 1 illustrates a functional block diagram of the image processing apparatus in the prior art.

Reference will now be made in detail to the exemplary embodiments, the same or similar reference numbers or components used in the drawings and the embodiments are used to represent the same or similar parts.

An embodiment of the invention is an image processing apparatus. In this embodiment, the image processing apparatus is applied to a display, such as Various types of display screen products such as computer screens, televisions, monitors, etc.

Figure 2:
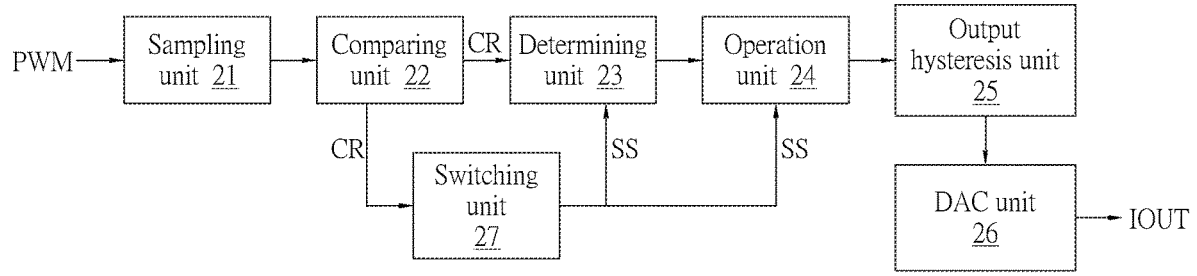
FIG. 2 illustrates a functional block diagram of the image processing apparatus in a preferred embodiment of the invention.

Please refer to FIG. 2. FIG. 2 illustrates a functional block diagram of the image processing apparatus in this embodiment. As shown in FIG. 2, the image processing apparatus 2 includes a sampling unit 21, a comparing unit 22, a determining unit 23, an operation unit 24, an output hysteresis unit 25, a digital analog conversion (DAC) unit 26 and a switching unit 27. The sampling unit 21 is coupled to the comparing unit 22; the comparing unit 22 is coupled to the determining unit 23; the determining unit 23 is coupled to the operation unit 24; the operation unit 24 is coupled to the output hysteresis unit 25; the output hysteresis unit 25 is coupled to the DAC unit 26 is coupled to the determining unit 23, the operation unit 24 and the output hysteresis unit 25 respectively.

The sampling unit 21 is configured to receive the pulse width modulation signal PWM and perform sampling, and then output the sampled image to the comparing unit 22. For example, the sampling unit 21 can sample the pulse width modulation signal PWM at a first time to obtain a first image (i.e., a previous image) and transmit it to the comparing unit 22. Then, the sampling unit 21 can sample the pulse width modulation signal PWM at a second time to obtain a second image (i.e., a current image) and transmit it to the comparing unit 22. The first time is earlier than the second time; that is, the first image (i.e., the previous image) is earlier than the second image (i.e., the current image).

When the comparing unit 22 receives the second image (i.e., the current image), the comparing unit 22 compares the second image (i.e., the current image) with the previously received first image (i.e., the previous image) to generate a comparison result CR and then output the comparison result CR to the determining unit 23. In practical applications, the comparison result CR generated by the comparing unit 22 can be a difference between the first image (i.e., the previous image) and the second image (i.e., the current image), such as a brightness difference value, but not limited to this.

After the determining unit 23 receives the comparison result CR generated by the comparing unit 22, the determining unit 23 will determine whether the second image (i.e., the current image) and the first image (i.e., the previous image) are the same according to the comparison result CR and the threshold value.

For example, if the comparison result CR is the difference between the first image (i.e., the previous image) and the second image (i.e., the current image), when the difference between the first image (i.e., the previous image) and the second image (i.e., the current image) is greater than the threshold value, it means that the two images should be different images. Therefore, the determining unit 23 will determine that the second image (i.e., the current image) is different from the first image (i.e., the previous image). At this time, both the operation unit 24 and the output hysteresis unit 25 will operate normally. When the operation unit 24 receives the second image (i.e., the current image), the operation unit 24 will perform a duty cycle operation on the second image (i.e., the current image), and then the output hysteresis unit 25 will output it to the DAC unit 26 to convert it into an output current IOUT.

When the difference between the first image (i.e., the previous image) and the second image (i.e., the current image) is smaller than or equal to the threshold value, it means that the two images should be the same image. Therefore, the determining unit 23 will determine that the second image (i.e., the current image) is the same as the first image (i.e., the previous image). At this time, both the operation unit 24 and the output hysteresis unit 25 will stop their operations, so that the second image (i.e., the current image) is not calculated and processed, but the operation result of the first image (i.e., the previous image) is directly used, and the digital analog conversion unit 26 will convert it into the output current IOUT.

In practical applications, the comparing unit 22 and the determining unit 23 can also be integrated into an input hysteresis unit, but not limited to this. In addition, the switching unit 27 can emit a switching signal SS according to the determination result CR of the determining unit 23 to switch between a normal mode and a power saving mode, thereby respectively controlling the operating unit 24 and the output hysteresis unit 25 to operate in the normal mode or stop operations in the power saving mode.

For example, when the determination result CR of the determining unit 23 is that the second image (i.e., the current image) is the same as the first image (i.e., the previous image), the switching unit 27 will transmit the switching signal SS to control the operating unit 24 and the output hysteresis unit 25 to stop their operations; when the determination result CR of the determining unit 23 is that the second image (i.e., the current image) is different from the first image (i.e., the previous image), the switching unit 27 emits the switching signal SS to control the operation unit 24 and the output hysteresis unit 25 to operate normally.

Please refer to FIG. 3A and FIG. 3B. FIG. 3A and FIG. 3B illustrate timing diagrams showing that whether the image obtained by sampling the pulse width modulation signal PWM is changed at different times.

As shown in FIG. 3A, since the pulse width modulation signal PWM maintains a constant pulse width, the image obtained by the sampling unit 21 sampling the pulse width modulation signal PWM at different times does not change; therefore, the determining unit 23 will determine that the second image (i.e., the current image) is the same as the first image (i.e., the previous image), and the operation unit 24 and the output hysteresis unit 25 will stop their operations.

As shown in FIG. 3B, since the pulse width of the pulse width modulation signal PWM cycled by the dotted line becomes wider, the image obtained by the sampling unit 21 sampling the pulse width modulation signal PWM will change; therefore, the determining unit 23 will determine that the second image (i.e., the current image) is different from the first image (i.e., the previous image), and the operation unit 24 and the output hysteresis unit 25 will operate normally.

Another embodiment of the invention is an image processing method. In this embodiment, the image processing method is applied to a display, such as various types of display screen products such as computer screens, televisions, and displays, which are common in the market, but not limited to this.

Figure 4:
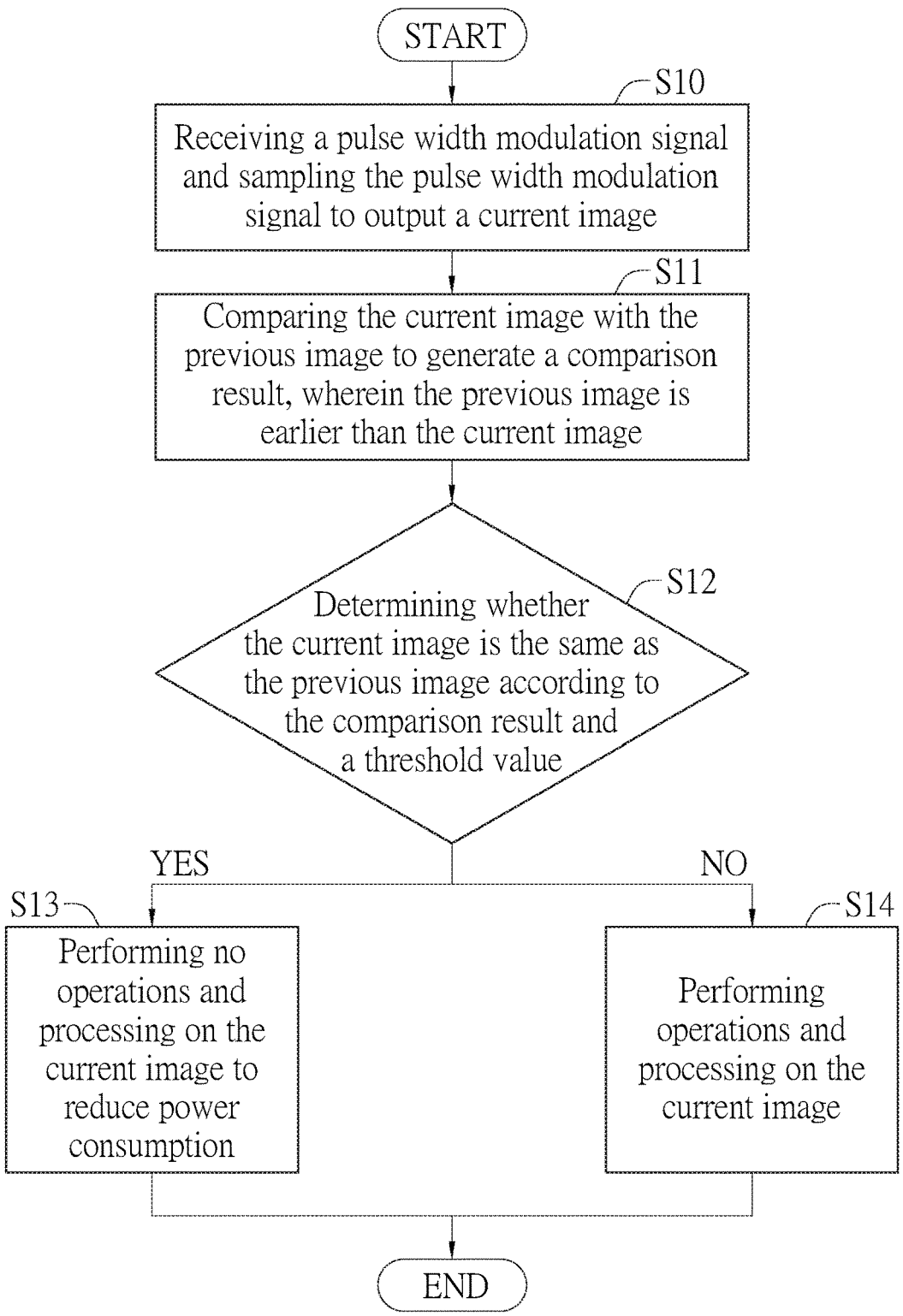
FIG. 4 illustrates a flowchart of the image processing method in another preferred embodiment of the invention.

Please refer to FIG. 4. FIG. 4 illustrates a flowchart of an image processing method in this embodiment. As shown in FIG. 4, the image processing method can include the following steps:

step S10: receiving a pulse width modulation signal and sampling the pulse width modulation signal to output a current image;

step S11: comparing the current image with the previous image to generate a comparison result, wherein the previous image is earlier than the current image;

step S12: determining whether the current image is the same as the previous image according to the comparison result and a threshold value;

if a determination result of the step S12 is YES, the image processing method performs the step S13: performing no operations and processing on the current image to reduce power consumption; and if the determination result of the step S12 is NO, the image processing method performs the step S14: performing operations and processing on the current image.

In practical applications, the comparison result generated by the step S11 can be a difference between the current image and the previous image. If the difference between the current image and the previous image is greater than the threshold value, it means that the two images should not be the same image. Therefore, the determination result in the step S12 is NO. If the difference between the current image and the previous image is smaller than or equal to the threshold value, it means that the two images should be the same image, so that the determination result of the step S12 is YES.

It should be noted that the step S14 can actually include the steps of performing a duty cycle operation on the current image, performing the digital analog conversion on the current image to generate an output current, and the like, but not limited to this. In addition, after the step S13, the image processing method can use the previous image instead of the current image and perform the digital analog conversion on the previous image to generate the output current.

Compared to the prior art, the image processing apparatus and the image processing method of the invention can avoid unnecessary image repetition calculation and processing when the display screen is not continuously updated, thereby saving power and computing resources. In addition, when the current image and the previous image are slightly different due to noise interference, the image processing apparatus and the image processing method of the invention directly use the operation result of the previous image without recalculating the current image, so that the noise caused by the slight jitter of the pulse width modulation signal can be effectively filtered to improve the quality of the displayed image. Therefore, the image processing apparatus and the image processing method of the invention can effectively solve the problems of power consumption and noise interference encountered by the prior art.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An image processing apparatus, applied to a display, the image processing apparatus comprising:
    a sampling unit, configured to receive a pulse width modulation signal and perform sampling to output a current image;
    a comparing unit, coupled to the sampling unit, configured to compare the current image with a previous image to generate a comparison result, wherein the previous image is earlier than the current image;
    a determining unit, coupled to the comparing unit, configured to determine whether the current image is the same with the previous image according to the comparison result and a threshold value; and
    an operation unit, coupled to the determining unit;
    wherein if a determination result of the determining unit is yes, then the operation unit stop its operation.

2. The image processing apparatus of claim 1, wherein the comparison result is a difference between the current image and the previous image.

3. The image processing apparatus of claim 2, wherein if the difference is larger than a threshold, then the determination result of the determining unit is NO, the operation unit performs a duty cycle operation on the current image.

4. The image processing apparatus of claim 2, wherein if the difference is smaller than or equal to the threshold, then the determination result of the determining unit is YES, the operation unit stops its operation to reduce power consumption.

5. The image processing apparatus of claim 1, further comprises:
    an output hysteresis unit, coupled to the operation unit; and
    a digital analog conversion unit, coupled to the output hysteresis unit;
    wherein if the determination result of the determining unit is YES, the output hysteresis unit also stops its operation; if the determination result of the determining unit is NO, the operation unit performs a duty cycle operation on the current image and then the output hysteresis unit outputs it to the digital analog conversion unit to convert it into an output current.

6. The image processing apparatus of claim 5, further comprises:
    a switching unit, coupled to the determining unit, the operation unit and the output hysteresis unit;
    wherein if the determination result of the determining unit is YES, then the switching unit controls the operation unit and the output hysteresis unit to stop their operations.

7. An image processing method, applied to a display, the image processing method comprising steps of:
    (a) receiving a PWM signal and sample the PWM signal to output a current image;
    (b) comparing the current image with a previous image to generate a comparison result, wherein the previous image is prior to the current image;
    (c) determining whether the current image is the same with the previous image according to the comparison result and a threshold value; and
    (d) if a determination result of the step (c) is YES, performing no operation and processing on the current image.

8. The image processing method of claim 7, wherein the comparison result is a difference between the current image and the previous image.

9. The image processing method of claim 8, wherein if the difference is larger than a threshold, then the determination result of the step (c) is NO, the image processing method further comprises a step of:

(e) performing a duty cycle operation on the current image.

10. The image processing method of claim 9, further comprising a step of:
(f) performing a digital analog conversion on the current image to generate an output current.

11. The image processing method of claim 8, wherein if the difference is smaller than or equal to the threshold, then the image processing method performs the step (d) to reduce power consumption.

12. The image processing method of claim 11, further comprising a step of:
(g) using the previous image and performing a digital analog conversion on the previous image to generate an output current.

* * * * *